(12) United States Patent
Liao

(10) Patent No.: US 8,142,202 B2
(45) Date of Patent: Mar. 27, 2012

(54) SOCKET CONNECTOR BRIDGING MOTHERBOARDS ARRANGED AT DIFFERENT LEVELS

(75) Inventor: Fang-Jwu Liao, Tu-Cheng (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 0 days.

(21) Appl. No.: 12/837,518

(22) Filed: Jul. 16, 2010

(65) Prior Publication Data

US 2011/0014801 A1 Jan. 20, 2011

(51) Int. Cl.
*H01R 12/00* (2006.01)
*H01R 24/00* (2011.01)

(52) U.S. Cl. .......................... 439/65; 439/626
(58) Field of Classification Search ............. 439/65, 439/626
See application file for complete search history.

(56) References Cited

U.S. PATENT DOCUMENTS

| 3,873,889 | A | * | 3/1975 | Leyba ............................ 439/77 |
| 4,924,179 | A | * | 5/1990 | Sherman ................... 324/756.02 |
| 5,319,526 | A | * | 6/1994 | Takashima ..................... 439/65 |
| 5,642,055 | A | * | 6/1997 | Difrancesco ................... 439/44 |
| 5,716,220 | A | * | 2/1998 | Siroky ........................... 439/61 |
| 7,256,345 | B2 | * | 8/2007 | Inoue ............................ 174/36 |
| 7,619,428 | B2 | * | 11/2009 | Richmond et al. ....... 324/750.08 |
| 2002/0048826 | A1 | * | 4/2002 | Richmond et al. ............. 438/14 |
| 2007/0212920 | A1 | * | 9/2007 | Clayton et al. ............... 439/326 |

* cited by examiner

*Primary Examiner* — Briggitte R Hammond
(74) *Attorney, Agent, or Firm* — Andrew C. Cheng; Wei Te Chung; Ming Chieh Chang

(57) ABSTRACT

An electrical socket comprises a socket body and a plurality of contacts. The socket body comprises a first section and a second section, the first section and the second section each having a plurality of contacts received therein, the first section defining an upper face being spaced away from a top face of the second section in a vertical direction.

13 Claims, 8 Drawing Sheets

SOCKET CONNECTOR BRIDGING MOTHERBOARDS ARRANGED AT DIFFERENT LEVELS

BACKGROUND OF THE INVENTION

1. Field of the Invention

The present invention relates to a socket connector, and more particularly to a socket connector capable of bridging two motherboards located at different levels.

2. Description of Prior Art

Electrical socket is widely used for electrically and mechanically connecting an electronic package such as a CPU to a PCB such as a motherboard. Generally, the electrical socket is mounted onto the motherboard from an upper surface and a back plate is mounted onto the motherboard from a lower surface so as to help the electrical socket steadily located on the motherboard.

With the development of society, people have a higher requirement on the performance of the Computer. One of such solutions is to use two or more CPUs in the computer. Accordingly, the CPUs work together so as to achieve a better performance.

Since most of the CPU socket is intended for only one intended CPU, if there is a need for additional CPU, then additional or second socket has to be mounted for facilitating the purpose. Obviously, the more the sockets are needed, the more real estate on the motherboard is needed and creating some issues. Each motherboard is pre-designed in view of its original intended purpose. Thus, it is hardly to mount an additional electrical socket onto the motherboard without firstly including it into the pre-fabricating design.

In view of the above, an improved electrical socket that overcomes the above-mentioned disadvantages is desired.

SUMMARY OF THE INVENTION

Accordingly, an object of the present invention is to provide a socket body capable of bridging two motherboards located at different levels.

To achieve the above-mentioned object, an electrical socket comprises a socket body and a plurality of contacts is provided. The socket body comprises a first section and a second section, the first section and the second section each having a plurality of contacts received therein, the first section defining an upper face being spaced away from a top face of the second section in a vertical direction. The electrical socket can synchronously connect with two electrical packages. Accordingly, people may use two or more electrical packages in one computer and achieve a high performance under condition that only one electrical socket is needed.

Other objects, advantages and novel features of the invention will become more apparent from the following detailed description when taken in conjunction with the accompanying drawings, in which:

DETAILED DESCRIPTION OF THE PREFERRED EMBODIMENT OF THE INVENTION

Figure 1:
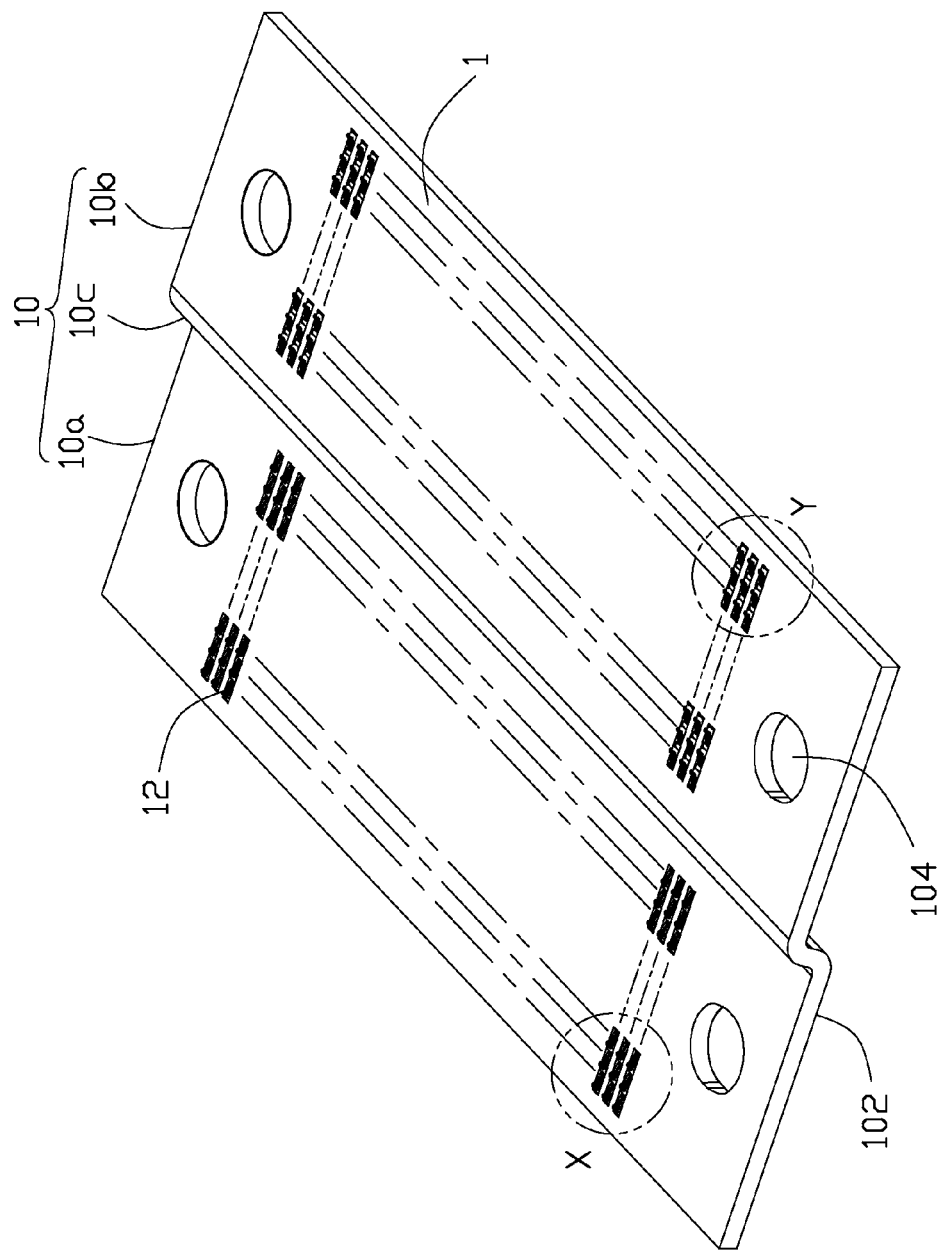
FIG. 1 is an isometric view of the electrical socket in accordance with a preferred embodiment of the present invention.
Figure 2:
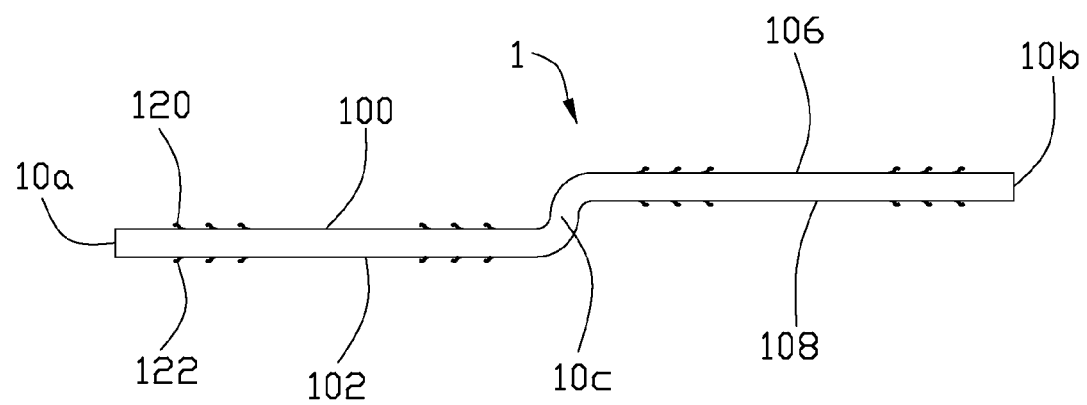
FIG. 2 is a side view of the electrical socket in accordance with a preferred embodiment of the present invention.
Figure 3:
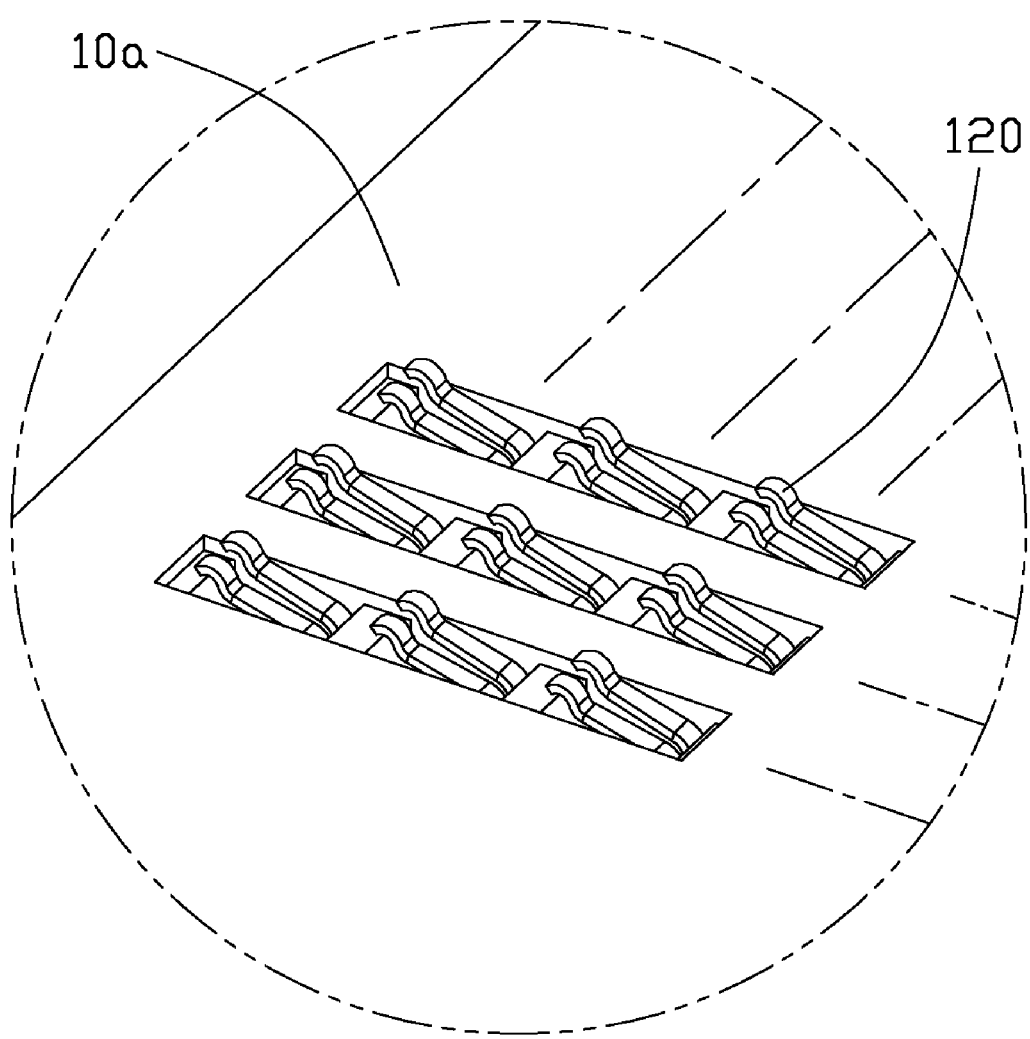
FIG. 3 is an enlarged view of the X portion shown in FIG. 1.
Figure 4:
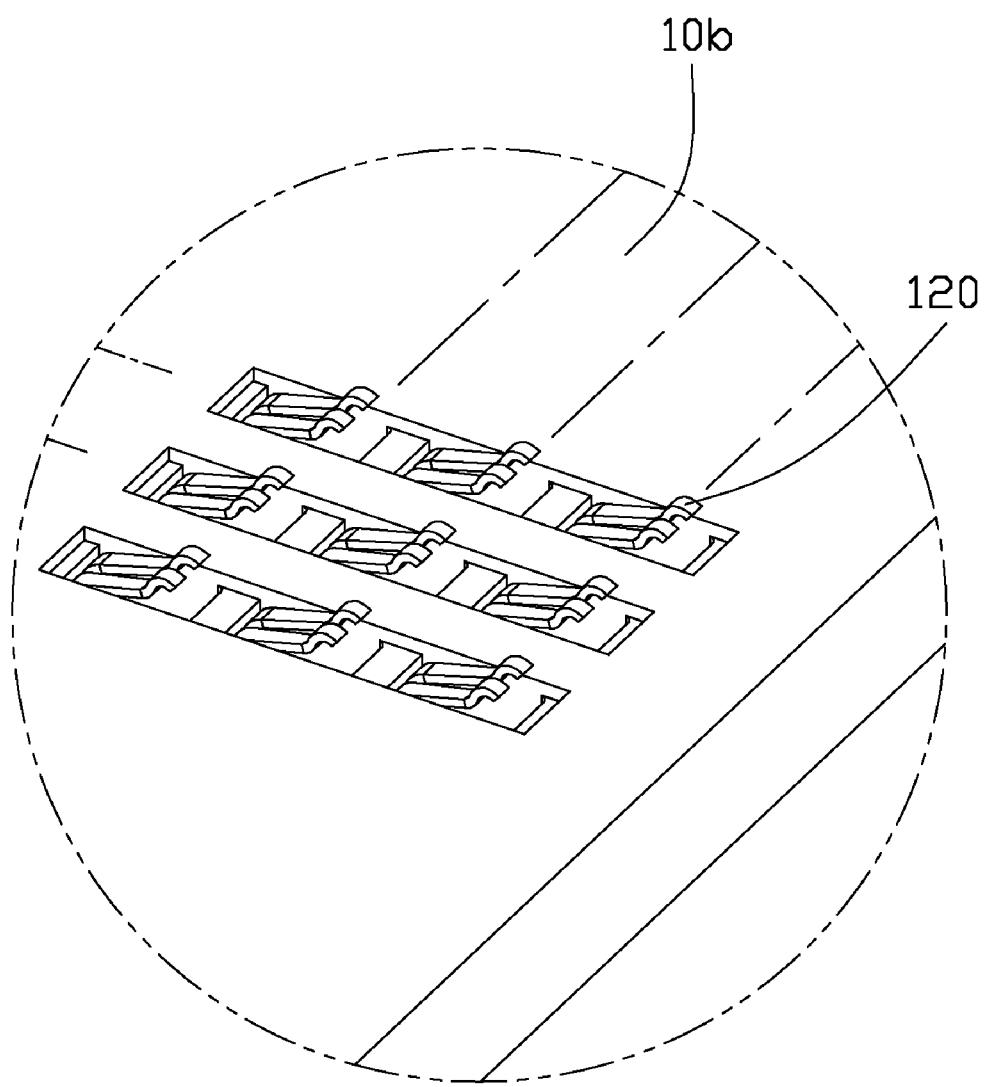
FIG. 4 is an enlarged view of the Y portion shown in FIG. 1.
Figure 5:
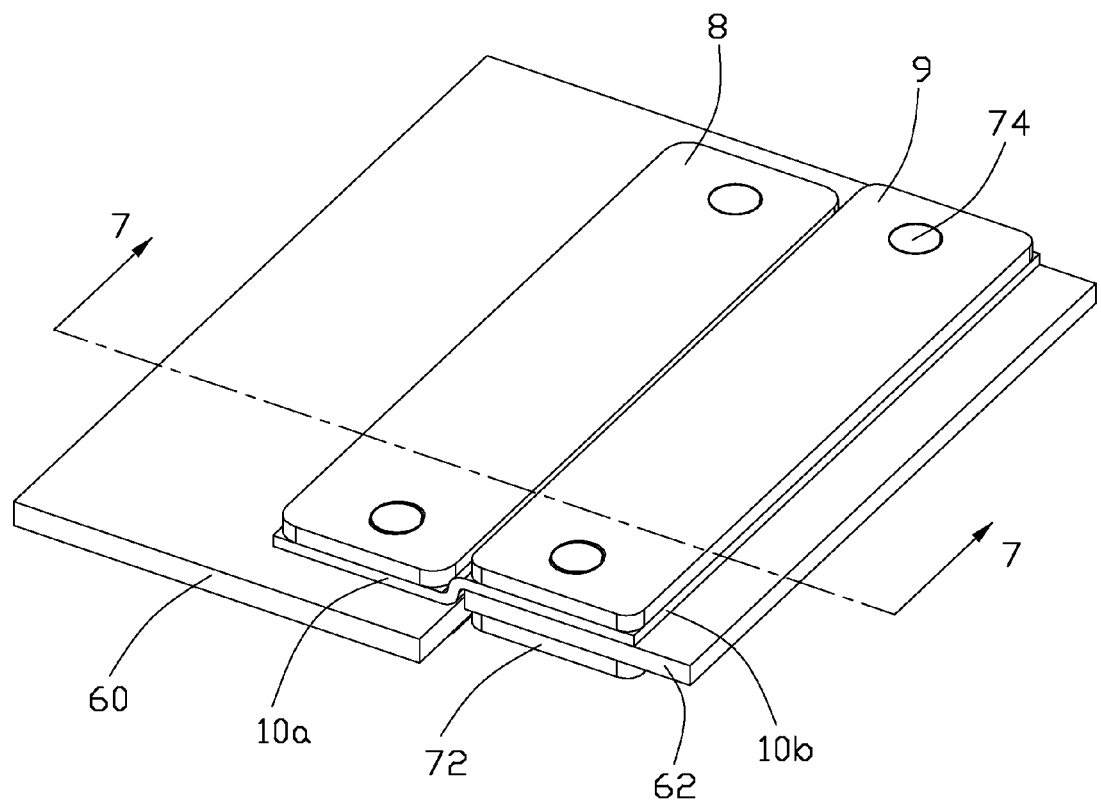
FIG. 5 is an assembled view of the electrical socket, the electrical package and the PCB.

Reference will now be made to the drawings to describe the present invention in detail.

Referring to FIGS. 1-8, an electrical socket 1 in accordance with a preferred embodiment of the present invention is used for electrically connecting electrical packages 8, 9 with a PCB assembly 6, comprising a socket body 10 and a plurality of spring contacts 12 received in the socket body 10.

The socket body 10 comprises a first section 10a, a second section 10b and a third section 10c interconnected the first and the second sections. The first section 10a defines an upper face 100 adapted to have the electrical package 8 mounted thereon and the second section 10b defines a top face 106 adapted to have the electrical package 9 mounted thereon. The upper face 100 of the first section 10a and the top face 106 of the second section 10b form an upper surface 100 of the socket body 10 facing the electrical packages 8, 9. Similarly, the first section 10a defines a lower face 102 facing the PCB assembly 6 and the second section 10b defines a bottom face 106 facing the PCB assembly 6. The lower face 102 of the first section 10a and the bottom face 108 of the second section 10b form a lower surface of the socket body 10 facing the PCB assembly 6.

In other words, the upper face 100 of the first section 10a is lower than the top surface of the second section 10b in a vertical direction. The lower face 102 of the first section 10b is depressed relative to the bottom surface of the second direction 10b in the vertical direction. The upper face 100 of the first section 10a is spaced away from the top face 106 of the second section 10b in the vertical direction. The lower face 102 of the first section 10a is spaced away the bottom face 108 of the second section 10b in the vertical direction. Moreover, all the faces extend in a horizontal direction perpendicular to the vertical direction. The third section 10c of the socket body extends in the vertical direction.

The first section 10a and the second section 10b each have a plurality of spring contacts 12 received therein. The spring contact 12 has an upper mating beam 120 extending upwardly and a lower upper mating beam 122 extending downwardly. Accordingly, the spring contacts 12 received in the first section 10a of the socket body 10 form a first group of spring contacts and the spring contacts 12 received in the second section 10a of the socket body 10 form a second group of spring contact. Upper mating beams 120 of the first group spring contacts are oriented in a first direction in the horizontal direction, and the second group of spring contacts are oriented in a second direction opposite to the first direction.

Referring to FIGS. 5-8, the electrical socket 1 may be mounted onto the PCB assembly 6 for electrically connecting with the two electrical packages 8, 9. The PCB assembly 6 comprises a first main plate 60 and a second main plate 62. In an assembly process, the first main plate 60 is attached to the lower face 102 of the first section 10a and the second main plate 62 is attached to the bottom face 108 of the second section 10b. As depicted above, the first main plate 60 is spaced away from the second main plate 62 in the vertical direction and located at a lower position. Additionally, a back plate assembly 7 will be used in the instant application in order to help the electrical socket 1 steadily located on the PCB assembly 6. The back plate assembly 7 comprises a first back plate 70 attached to the first main plate 60 from a lower position of the first main plate 60, and a second back plate 72 attached to the second main plate 62 from a lower position of the second main plate 62.

Figure 6:
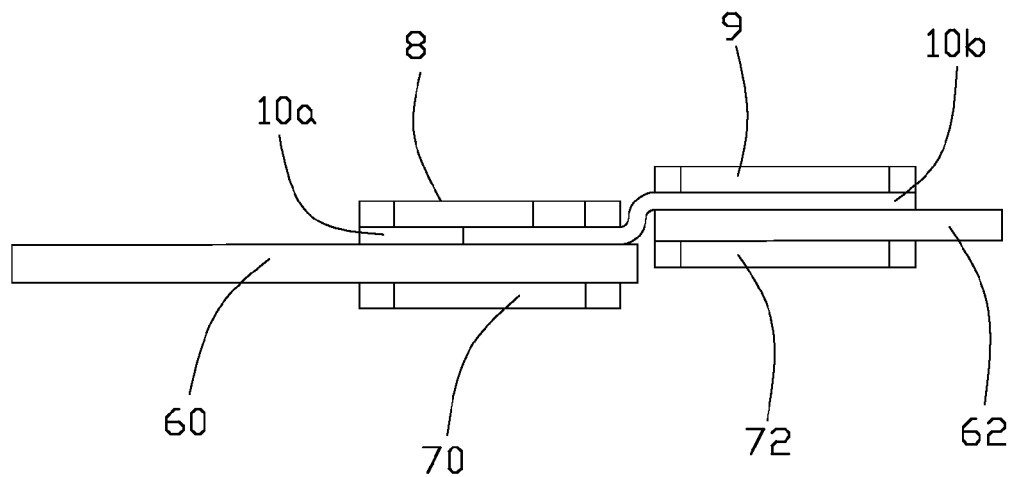
FIG. 6 is a side view of the assembly shown in FIG. 5.
Figure 7:
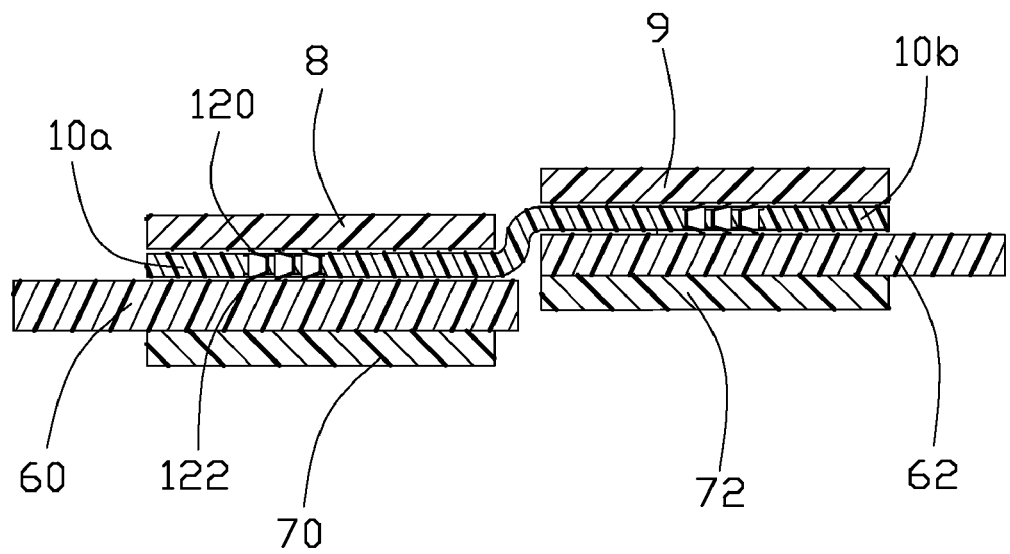
FIG. 7 is a cross-section view taken along line 7-7 in FIG. 5.
Figure 8:
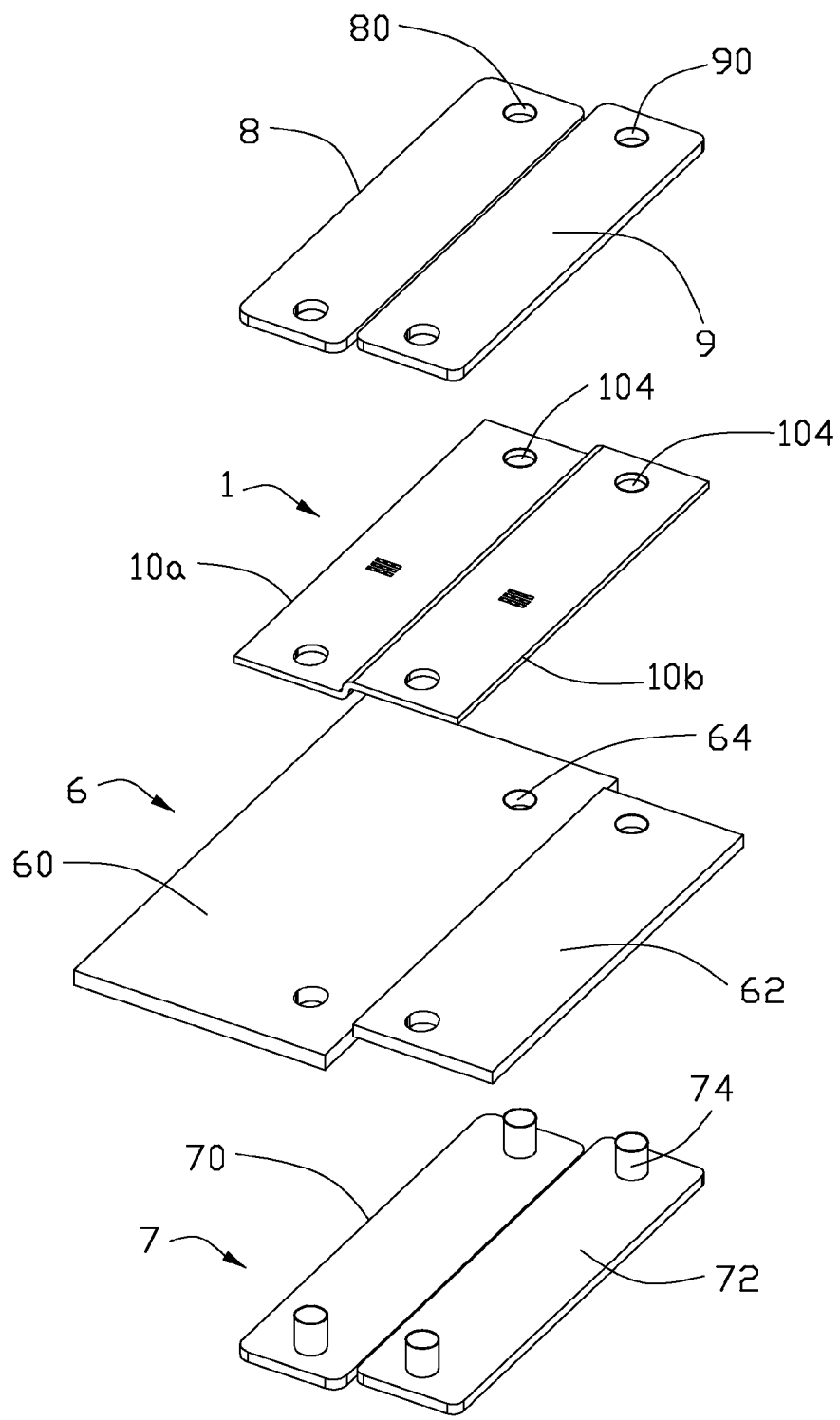
FIG. 8 is an isometric, exploded view of assembly shown in FIG. 5.

Referring to FIGS. 6-8, both the first section 10a and the second section 10b of the socket body 1 define a plurality of through holes 104. The first main plate 60 and the second main plate 62 correspondingly define a plurality of mounting holes 64. The first back plate 70 and the second back plate 72 correspondingly define a plurality of posts 74. Thus, the electrical socket 1, the PCB assembly 6 and the back plate 7 can be assembled together by the posts 74. In addition, the electrical packages 8, 9 also define a plurality of openings 80, 90 respectively. Accordingly, the electrical packages 8, 9 will be mounted onto the first section 10a and the section 10b, respectively.

The electrical socket 1 can synchronously connect with the two electrical packages 8, 9. Accordingly, people may use two or more electrical packages in one computer and achieve a high performance under condition that only one electrical socket is needed. Accordingly, the system companies can buildup a computer in which more than one CPU can be deployed so as to operate it at high-clock speed, while only a single socket connector is used.

While the preferred embodiment in accordance with the present invention has been shown and described, equivalent modifications and changes known to persons skilled in the art according to the spirit of the present invention are considered within the scope of the present invention as defined in the appended claims.

What is claimed is:

1. A socket connector, comprising:
a socket body comprising a first section and a second section, the first section and the second section each having a plurality of contacts received therein, the first section defining an upper face being spaced away from a top face of the second section in a vertical direction;
wherein the contacts received in the first section extend beyond the upper face and a lower face of the first section;
wherein the contacts received in the second section extend beyond the top face and a bottom face of the second direction.

2. The socket connector as claimed in claim 1, wherein the first section further defines a lower face being spaced away a bottom face of the second section in the vertical direction.

3. The socket connector as claimed in claim 2, wherein the upper face and the lower face are at a lower position relative to the top face and the bottom face in the vertical direction, respectively.

4. The socket connector as claimed in claim 3, wherein all the faces extend in a horizontal direction perpendicular to the vertical direction.

5. The socket connector as claimed in claim 2, wherein the contacts each have an upper mating beam extending upwardly.

6. The socket connector as claimed in claim 5, wherein the upper mating beams of the contacts receiving in the first section extend upwardly and beyond the upper face, the upper mating beams of the contacts receiving in the second section extend upwardly and beyond the top face.

7. The socket connector as claimed in claim 6, wherein the upper mating beams arranged in the first section are oriented in a first direction, while the upper mating beams arranged in the second section are oriented in a second direction, said first direction is opposite to the second direction in the horizontal direction.

8. The socket connector as claimed in claim 7, wherein the first section and second section are interconnected with one another via a third section extending in the vertical direction.

9. A socket connector assembly, comprising:
a PCB assembly; and
a socket connector mounted on the PCB assembly, comprising:
a socket body having an upper surface and a lower surface, which is opposite to the PCB assembly when the socket connector is mounted onto the PCB assembly, the upper surface defining a first sector and a second sector depressed relative to the first sector in a vertical direction, the lower surface defining a first part and a second part corresponding to the first sector and second sector, respectively, said second part being depressed relative to the first part in the vertical direction;
a first group of spring contacts received in a first section of the socket body defined by the first sector of the upper surface and the first part of the lower surface;
a second group of spring contacts received in a second section of the socket body defined by the second sector of the upper surface and the second part of the lower surface;
said PCB assembly comprising:
a first main plate and a second main plate attached to the first part and second part of the lower surface, respectively, said first main plate and second main plate being spaced in the vertical direction.

10. The socket connector assembly as claimed in claim 9, further comprising a back plate assembly having a first back plate attached to the first main plate from a lower position of the first main plate and a second back plate attached to the second main plate from a lower position of the second main plate.

11. The socket connector assembly as claimed in claim 10, wherein each of the first section and second section of the socket body has a plurality of through holes, said PCB assembly correspondingly defining a plurality of mounting holes and said back plate assembly correspondingly defining a plurality of posts.

12. The socket connector assembly as claimed in claim 11, wherein the first group of spring contacts is oriented in a first direction and the second group of spring contacts is oriented in a second direction opposing the first direction.

13. A socket connector assembly comprising:
an insulative housing providing a horizontal first level and a horizontal second level interconnected thereto and located higher than the first level in a vertical direction; and
each of the first and second levels provided with contact terminals; wherein the housing is assembled to a primary circuit board at one of said first level and the second level, and further assembled to a secondary circuit board at the other of the first level and the second level under condition that the primary circuit board and the secondary circuit board are spaced from each other in a longitudinal direction along which said second level extends from the first level, and are offset from each other in said vertical direction; wherein the primary circuit board is assembled below the first level and the secondary circuit board is assembled below the second level; and wherein an electronic package is seated above the first level and somewhat coplanar with the second level.

* * * * *